United States Patent [19]
Fukuta et al.

[11] Patent Number: 5,814,366
[45] Date of Patent: Sep. 29, 1998

[54] METHOD OF MANUFACTURING MULTILAYERED CERAMIC SUBSTRATE

[75] Inventors: Junzo Fukuta; Koji Shibata; Nozomi Tanifuji, all of Nagoya; Masaya Hashimoto, Sakai; Yoshiaki Yamade, Nishinomiya; Hidenori Kataura, Mine, all of Japan

[73] Assignees: Sumitomo Metal Electronics Devices Inc., Mine; Sumitomo Metal Industries, Ltd., Osaka, both of Japan

[21] Appl. No.: 682,410

[22] Filed: Jul. 17, 1996

[30] Foreign Application Priority Data

Jul. 17, 1995 [JP] Japan ..................................... 7-179958
May 13, 1996 [JP] Japan ..................................... 8-117296

[51] Int. Cl.$^6$ ....................................................... B05D 5/12
[52] U.S. Cl. .......................... 427/96; 428/446; 156/89.11; 338/307; 338/308; 338/314
[58] Field of Search .................................. 156/89, 89.11; 428/446; 427/96; 338/314, 308, 307

[56] References Cited

FOREIGN PATENT DOCUMENTS 5-163072 6/1993 Japan .
91 10630 7/1991 WIPO .

*Primary Examiner*—Melvyn I. Marquis
*Attorney, Agent, or Firm*—Foley & Lardner

[57] ABSTRACT

In a method of manufacturing a multilayered ceramic substrate, a capacitor layer is formed on a green sheet of a low temperature co-firable ceramic by means of printing. The green sheet with the capacitor layer and a plurality of other green sheets are laminated together into a substrate laminate. Two release green sheets of alumina system each unsintered below 1,000° C. are further laminated to the top and the bottom of the substrate laminate respectively. The obtained laminate is fired at a temperature ranging between 800° and 1,000° C. under pressure ranging between 2 and 20 kgf/cm$^2$. The release green sheets adherent to the side surfaces of the substrate are removed after the firing. Subsequently, a wiring pattern is printed on the substrate, which is then fired at a temperature ranging between 800° and 1,000° C.

11 Claims, 3 Drawing Sheets

PRESSURIZATION

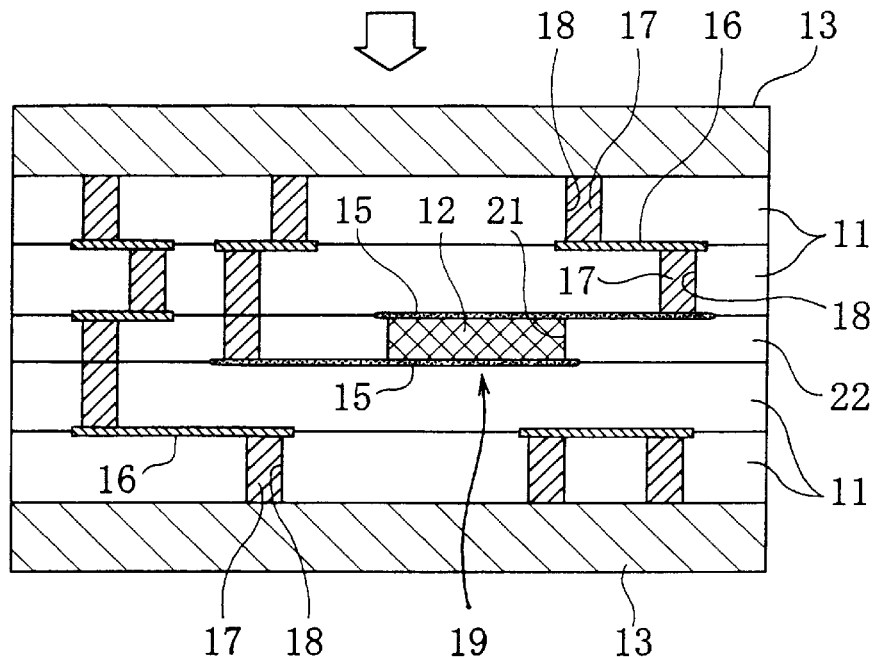
F I G. 3A
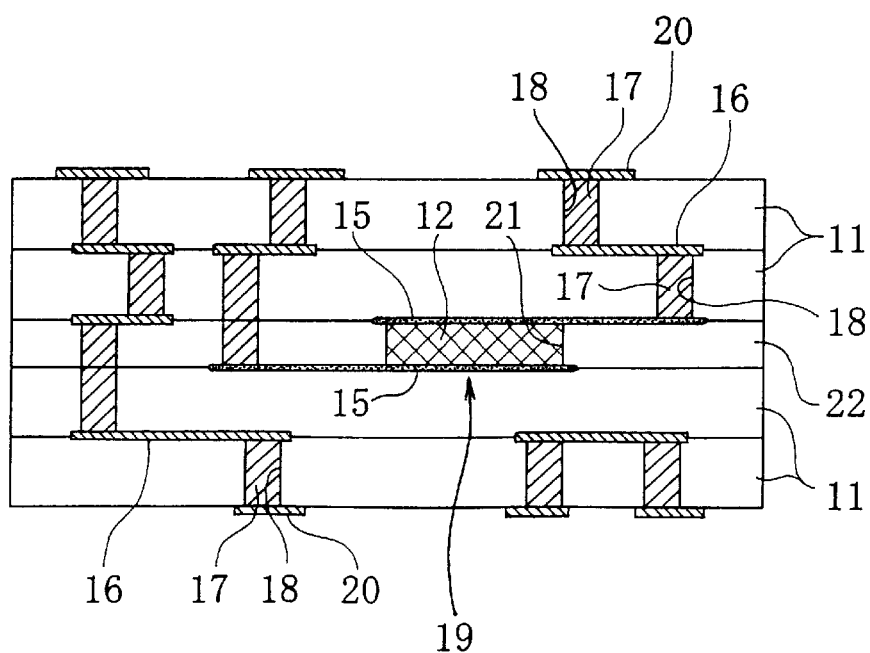
F I G. 3B

METHOD OF MANUFACTURING MULTILAYERED CERAMIC SUBSTRATE

BACKGROUND OF THE INVENTION

1. Field of the invention

This invention relates to a method of manufacturing a multilayered ceramic substrate with an integrally incorporated capacitor by co-firing a substrate laminate and the capacitor at a temperature ranging between 800° and 1,000° C.

2. Description of the prior art

The prior art has recently provided a multilayered ceramic substrate in which a capacitor is laminated to one of inside layers thereof and co-fired with a substrate laminate for the purposes of high density mounting and high integration of electronic circuits or the like. However, a ceramic material for the substrate and a dielectric material for the capacitor differ in the chemical composition and a firing shrinkage characteristic. Accordingly, when both of the materials are laminated together and co-fired, the difference in the firing shrinkage characteristic between them tends to result in camber, cracks, or distortion in the fabricated substrate.

Furthermore, the density is reduced in the sintered layer or layers of either the ceramic or the dielectric material when these materials differ in a sintering termination temperature. On one hand, an insulation performance is lowered between wiring conductors in the substrate when the density is reduced in the sintered layers (insulator layers) of the ceramic material. On the other hand, an insulation performance of a dielectric of the capacitor is lowered when the density in the sintered layer (dielectric layer) is reduced.

Thus, the firing shrinkage characteristic and the sintering termination temperature of the ceramic material is required to agree with those of the dielectric material respectively, and vice versa so that the camber, cracks, or distortion in the fabricated substrate and the reduction of the density in the insulator or dielectric layers after the firing are prevented. Actually, however, it is extremely difficult to select the ceramic and the dielectric materials which can provide strictly the same firing shrinkage characteristic and sintering termination temperature. Under these circumstances, accordingly, ceramic and dielectric materials are used which provide the firing shrinkage characteristics and firing termination temperatures more or less different from each other respectively.

The inventors are now engaged in research into a new firing method which can prevent camber, cracks, or distortion of the substrate and reduction in the density of each of the insulator layer and the dielectric layer even when the ceramic and the dielectric materials are used which provide the firing shrinkage characteristics and firing termination temperatures more or less different from each other respectively. In this firing method, the substrate is fired under the pressurized condition. Methods of firing a substrate under the pressurized condition are disclosed in PCT WO91/10630 and publication No. 5-163072 (1993) of unexamined Japanese patent application. In the former publication, release green sheets are laminated to upper and lower surfaces of an insulator ceramic green sheet respectively. Each release green sheet is not sintered at a firing temperature of the insulator ceramic green sheet. An assemblage of the ceramic green sheet and release green sheets is fired at a predetermined firing temperature with pressure being applied to an exposed surface of the release green sheet. Thereafter, the unsintered release green sheets are removed from both surfaces of the sintered ceramic body, whereby a ceramic substrate is fabricated.

In the above-described method, the assemblage is fired under the pressurized condition in order that shrinkage of the substrate in the directions of its surface is reduced so that dimensional variations in the fabricated substrates are reduced. However, the disclosed firing method is not directed to a multilayered substrate with an integrally incorporated capacitor (a dielectric layer) which has the firing shrinkage characteristic and sintering termination temperature different from those of the substrate (a green sheet).

The latter (publication No. 5-163072) of the above publications discloses a method wherein a multilayered ceramic substrate with an integrally incorporated capacitor is fired under the pressurized condition. See page 13, paragraph number [0054] of the publication. In this method, however, the capacitor is previously fired and then laminated to one of ceramic green sheets. An assemblage of the ceramic green sheets and the fired capacitor is fired under the pressurized condition. This method thus requires the capacitor to be separately fired prior to the firing of the ceramic substrate. Consequently, the fabrication efficiency is low and the fabrication cost is increased since the substrate and the capacitor cannot be co-fired.

SUMMARY OF THE INVENTION

Therefore, an object of the present invention is to provide a method of manufacturing a multilayered ceramic substrate, in which method a capacitor and a substrate can be co-fired for improvement of the fabrication efficiency, and camber, cracks, or distortion of the substrate and reduction in the density of each of the insulator layers and the dielectric layer after firing can be prevented so that a reliable multilayered ceramic substrate with an integrally incorporated capacitor can be fabricated.

To achieve the object, the present invention provides a method of manufacturing a multilayered ceramic substrate with an integrally incorporated capacitor comprising the steps of forming a substrate laminate having a capacitor interposed between green insulator layers each comprised of a low temperature co-firable ceramic insulator material, the capacitor comprising a green dielectric layer comprised of a low temperature co-firable ceramic dielectric material and electrode conductors sandwiching the dielectric layer, laminating release green sheets unsintered at a substrate firing temperature to both sides of the substrate laminate respectively, firing the substrate laminate with the release green sheets at the substrate firing temperature while applying thereto a pressure normal to an exposed surface of one of the release green sheets, the pressure ranging between 2 and 20 kgf/cm$^2$, and removing the release green sheets from both sides of the fired assemblage, thereby fabricating the multilayered ceramic substrate with an integrally incorporated capacitor.

The density of the multilayered ceramic substrate is improved as the pressure applied during the firing is increased. However, the substrate is subjected to deformation when the applied pressure is increased to or above 20 kgf/cm$^2$. Furthermore, the applied pressure is too small to improve the density of the substrate when the applied pressure is below 2 kgf/cm$^2$. Accordingly, a suitable range of the applied pressure is between 2 and 20 kgf/cm$^2$. When the applied pressure is in the range, camber, cracks, or distortion of the substrate can be prevented and the density of each of the insulator and dielectric layers of the substrate after the firing can be improved such that a better insulation performance of the insulator and dielectric layers can be ensured.

A method of incorporating a capacitor in an inside layer of the substrate includes a green sheet laminating method and a printing method. In the green sheet laminating method, a dielectric green sheet is embedded in a layer in which a capacitor is to be formed. A portion of the dielectric green sheet sandwiched between electrodes is used as a dielectric layer of the capacitor. In this structure, the dielectric layer requires a high density or a high liquid penetration proof since the dielectric layer or the dielectric green sheet is exposed at a peripheral end face of the substrate. The reason for this is that migration progresses in the metal electrodes sandwiching the dielectric layer of the capacitor under the presence of liquid, resulting in a short circuit in the dielectric layer.

In the above-described invention, however, the density of the dielectric layer can be increased by the firing under the pressurized condition. Consequently, penetration of liquid into the dielectric layer can be prevented even when the capacitor is formed according to the green sheet laminating method.

On the other hand, a low temperature co-firable ceramic dielectric material is printed on an insulator green sheet (a green insulator layer) formed from a low temperature co-firable ceramic insulator material with an electrode conductor being placed therebetween in the printing method, whereupon a green dielectric layer is formed. Thus, the dielectric layer of the capacitor can be formed on a part of the inside layer of the substrate by printing. Consequently, since the dielectric layer is not exposed at the peripheral end face of the substrate, this can further improve the insulation performance of the dielectric layer together with the improvement in the density of the dielectric layer due to the firing under the pressurized condition.

It is generally preferred that a dielectric layer have a thickness of or above 30 $\mu$m after the sintering for the ensuring of a sufficient insulation performance between the electrode conductors or that the dielectric layer have a thickness of or above 60 $\mu$m while being dried in its paste phase before the sintering. When upper and lower electrode conductors are added to the dielectric layer, the whole capacitor should have a thickness of or above 80 $\mu$m before the sintering. When the capacitor is placed between insulator green sheets and the assemblage is then fired under pressure, a stepped portion of or above 80 $\mu$m thick is formed on the layer in which the capacitor is formed. Since the applied pressure is concentrated on the capacitor, there is a possibility that an outer peripheral end of the capacitor may be squeezed by the applied pressure to be deformed. This may reduce the insulation performance.

In view of the above-described problem, in a preferred form of the present invention, a green dielectric layer is formed by laminating a spacer insulator green sheet having an opening defining a formation area of a dielectric layer to an inside insulator green sheet and filling the opening with the low temperature fired ceramic dielectric material in a process of laminating the insulator green sheets. This has the effect that no stepped portion due to the dielectric layer is formed on the layer in which the capacitor is to be formed. When the substrate laminate formed as described above is fired under pressure, the applied pressure is received dispersively by the capacitor and the spacer insulator green sheet in the layer in which the capacitor is to be formed, and accordingly, deformation of the outer peripheral end of the capacitor can be prevented by the spacer insulator green sheet.

Each electrode conductor preferably comprises Au, an Au alloy, or Ag/Pd having an Ag/Pd weight ratio ranging between 90/10 to 60/40. This has the effect that the reliability of the insulation performance of the dielectric layer can be improved even when the firing shrinkage characteristic and the sintering termination temperature of the insulator layer are not required to agree with those of the dielectric layer respectively. This was confirmed by experiments carried out by the inventors.

The dielectric layer may comprise a compound of Pb-perovskite. The Pb-perovskite compound has a high dielectric constant and can be co-fired with the low temperature fired ceramic insulator material at or below 1,000° C. Consequently, the Pd-perovskite compound is suitable for a material for the capacitor.

The low temperature co-firable ceramic insulator material preferably comprises a mixture of a glass powder of a system of $CaO-Al_2O_3-SiO_2-B_2O_3$ or a system of $MgO-Al_2O_3SiO_2-B_2O_3$ and an $Al_2O_3$ powder. The mixture causes partial crystallization of an anorthite, anorthite+calcium silicate (wollastonite), or cordierite in the firing process. The mixture enables the substrate laminate to be fired at a temperature ranging between 800° and 1,000° C. in an oxidizing atmosphere (air) possible. Furthermore, the mixture shortens a firing period of time with deformation of fine patterns in the firing process being restricted by the above-described partial crystallization.

The substrate laminate preferably has inside or surface layers formed with wiring and interlayer via conductors each comprising Au, Ag, Ag/Pd, Ag/Pt, or Cu. Since these metal pastes have respective sintering temperatures at about or above 1,000° C., they can be co-fired with the low temperature fired ceramic and have better electric characteristics as compared with metals of high melting points such as W or Mo.

Furthermore, the substrate laminate preferably has an inside or surface layer formed with a resistor comprising $RuO_2$ or an Ru pyrochlore. $RuO_2$ or the Ru pyrochlore can be co-fired with the low temperature fired ceramic and can provide relatively easy adjustment of resistance value of the resistor even when it is formed on an inside layer.

Each release green sheet preferably comprises an alumina green sheet. The alumina green sheet is relatively inexpensive in ceramics for practical use and meets a requirement of reduction in the fabrication cost.

BRIEF DESCRIPTION OF THE DRAWINGS

Other objects, features and advantages of the present invention will become clear upon reviewing the following description of preferred embodiments thereof, made with reference to the accompanying drawings, in which:

FIG. 3A is a longitudinal section of the substrate with the release green sheets laminated to both sides thereof in the second embodiment; and FIG. 3B is a longitudinal section of the substrate in which the release green sheets have been removed therefrom and surface conductors are printed thereon, in the second embodiment.

DETAILED DESCRIPTION OF THE PREFERRED EMBODIMENTS

Figure 1A:
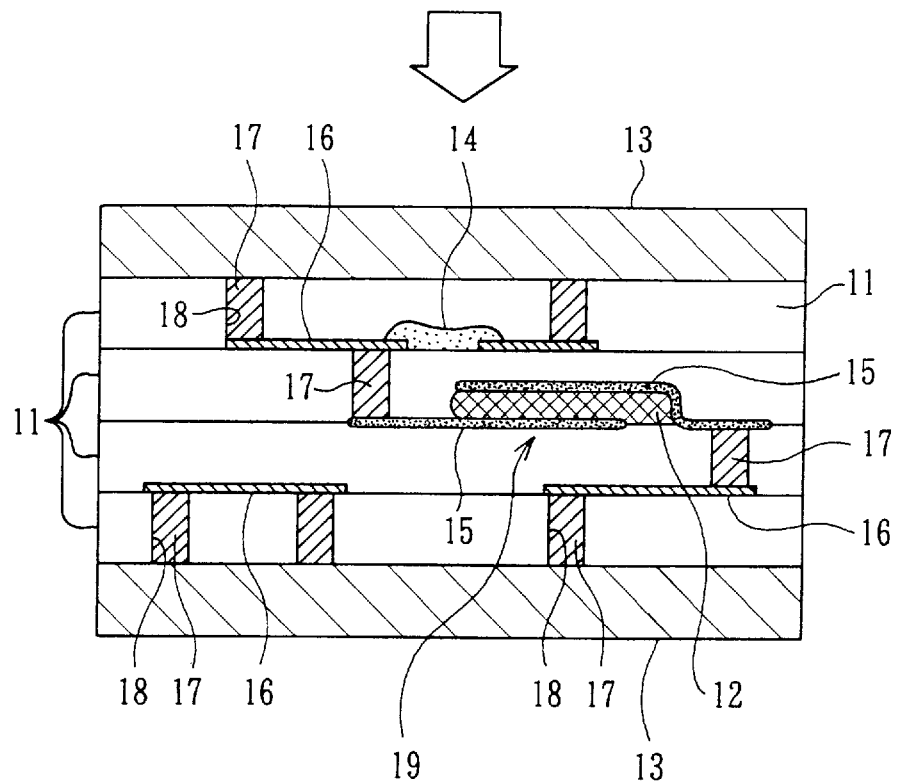
FIG. 1A is a longitudinal section of a substrate with release green sheets laminated to both sides thereof in a first embodiment in accordance with the present invention.
Figure 1B:
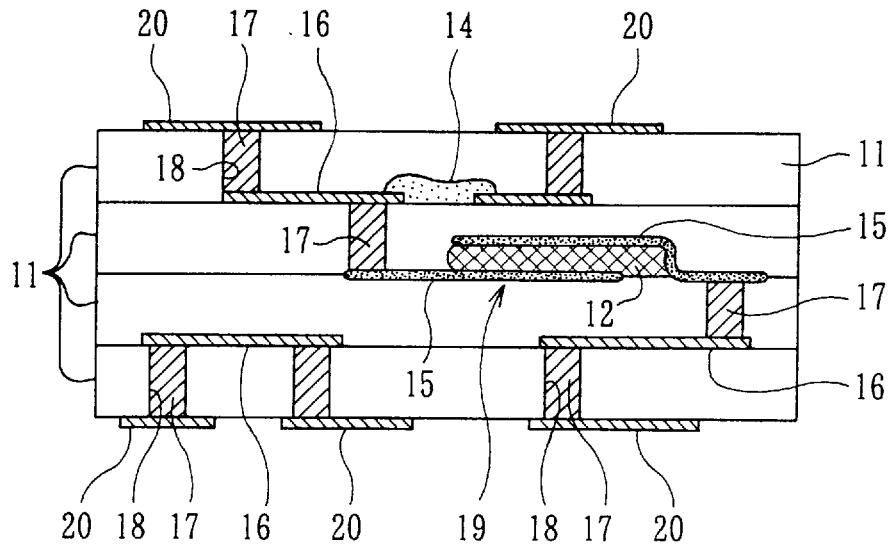
FIG. 1B is a longitudinal section of the substrate in which the release green sheets are removed therefrom and surface conductors are printed thereon.

First embodiment:

A first embodiment of the method in accordance with the present invention will be described with reference to FIGS. 1A and 1B. The method of manufacturing a multilayered ceramic substrate in the first embodiment comprises the following steps:

1. Fabrication of insulator green sheets 11 (green insulator layers):

A mixture containing 10 to 55% CaO by weight, 45 to 70% $SiO_2$ by weight, 0 to 30% $Al_2O_3$ by weight, and 5 to 20% $B_2O_3$ by weight is melted at 1,450° C. to be vitrified. Thereafter, the vitrified mixture is rapidly quenched in water and then pulverized into a glass powder of $CaO\text{-}SiO_2\text{-}Al_2O_3\text{-}B_2O_3$ system having an average grain diameter ranging between 3.0 and 3.5 $\mu$m. A low temperature co-firable ceramic insulator mixed powder is made by mixing 50 to 65% (preferably, 60%) glass powder by weight and 50 to 35% (preferably, 40%) alumina powder by weight having an average grain diameter of 1.2 $\mu$m. A solvent such as toluene or xylene, a binder such as an acrylic resin, and a plasticizer such as DOA are added to the mixed powder. The mixture is well blended so that a slurry having a viscosity of 2,000 to 40,000 cps is obtained. The slurry is made by a conventional doctor blade process into an insulator green sheet 11 of 0.3 mm in thickness. The insulator green sheet 11 is claimed in the appended claims as a green insulator layer and firable at a temperature ranging between 800° to 1,000° C.

2. Fabrication of release green sheets 13 (alumina green sheets):

The solvent, binder, and platicizer same as those as above-mentioned are mixed with an alumina powder having an average grain diameter of 1.0 $\mu$m. The mixture is well lended into a slurry. The slurry is made by the conventional doctor blade process into an alumina green sheet of 0.3 mm in thickness. The alumina green sheet is used as release green sheets 13, as will be described later. The release green sheet 13 is adapted to be sintered when heated up to a range of 1,550° to 1,600° C.

3. Fabrication of a dielectric paste 12:

A compound of Pb-perovskite such as $PbO\text{-}Fe_2O_3\text{-}Nb_2O_5WO_3\text{-}ZnO$ is used as a low temperature co-firable ceramic dielectric material. A predetermined quantity of compound is weighed on the scales and then pulverized, mixed, and dried sequentially. The dried compound is then calcinated at 850° C. and subsequently, wet ground and formed into a dielectric powder having an average grain diameter of 2 $\mu$m after being dried. A binder such as ethyl cellulose and a solvent such as terpineol are added to the obtained dielectric powder, and the mixture is then blended by a three roll blending machine into a dielectric paste 12 comprised of the low temperature co-firable ceramic dielectric material. The dielectric paste 12 is screen printed on the insulator green sheet 11 to be formed into a green dielectric layer as will be described later. The dielectric paste 12 is co-firable with the insulator green sheet 11 at or below 1,000° C.

4. Fabrication of a resistor paste of $RuO_2$ system:

A mixture of an $RuO_2$ powder having an average grain diameter of 0.1 mm and a glass powder of $CaO\text{-}SiO_2\text{-}Al_2O_3\text{-}B_2O_3$ is used as a material for a resistor. A binder such as ethyl cellulose and a solvent such as terpineol are added to the mixture, and the mixture is then blended by the three roll blending machine into a resistor paste 14 of $RuO_2$ system. The resistor paste 14 is also co-firable with the insulator green sheet 11 at or below 1,000° C.

5. Fabrication of an electrode conductor paste 15:

In examples 1 to 4 which will be described later, Au or an Au alloy such as Au/Pd/Ag is used as an electrode conductor material for an incorporated capacitor. The binder such as ethyl cellulose and the solvent such as terpineol are added to an Au powder having an average grain diameter of 1 $\mu$m or an Au alloy powder, and the mixture is then blended by the three roll blending machine into an electrode conductor paste 15.

In examples 5 to 8 which will be described later, a mixture of an Ag powder and Pd powder having an Ag/Pd weight ratio ranging between 90/10 and 60/40 or an Ag/Pd alloy powder having the same weight ratio as described above is used as the electrode conductor material. The binder such as ethyl cellulose and the solvent such as terpineol both same as those described above are added to the mixture. The mixture is then blended by the three roll blending machine to be formed into an electrode conductor paste 15.

6. Fabrication of wiring and interlayer via conductor pastes 16 and 17:

Au, Ag, Ag/Pd, Ag/Pt, or Cu is used as a conductor material for wiring and interlayer vias formed in the inside layers of the substrate. The binder such as ethyl cellulose and the solvent such as terpineol both same as those described above are added to the metal powder. The mixture is then blended by the three roll blending machine to be formed into electrode conductor pastes 16 and 17.

7. Fabrication of a surface layer conductor paste 20:

Au, Ag, Ag/Pd, Ag/Pt, or Cu is used as a material for wiring conductor formed in a surface layer of the substrate. The metal paste is formed into a surface layer conductor paste 20 by the same process as described above.

8. Punching, printing, and laminating:

The insulator green sheets 11 and the release green sheets 13 are cut so as to have predetermined dimensions respectively. Via holes 18 are formed in predetermined locations in the insulator green sheets 11 by means of punching. The via holes 18 are then filled with the interlayer via conductor paste 17, and the wiring conductor paste 16 having the same composition as the paste 17 is screen printed on the insulator green sheets 11 to be formed into wiring patterns. The electrode conductor paste 15 is screen printed on an inside layer insulator green sheet 11 in which a capacitor 19 is to be formed, whereupon a lower electrode of the capacitor 19 is formed. The dielectric paste 12 is screen printed on the upper surface of the bottom electrode to be formed into a dielectric layer having a thickness of 60 $\mu$m. Furthermore, the electrode conductor paste 15 is screen printed on the upper surface of the dielectric layer to be formed into an upper electrode of the capacitor 19. Additionally, the resistor paste 14 of $RuO_2$ system is screen printed on another inside layer insulator green sheet 11 to be formed into a resistor. The above-described green sheets 11 are laminated to one another into a substrate laminate, which laminate is heated at 80° to 150° C. and then crimped at 50 to 250 kg/cm² to be thereby integrated into a single body. Furthermore, the unfired release green sheets 13 are laminated to both side faces of the substrate laminate respectively, and the laminate is heated and then crimped under the same conditions as described above.

9. Firing:

The substrate laminate fabricated as described above is fired at a substrate firing temperature of 800° to 1,000° C. (preferably, 900° C.) while a pressure normal to an exposed surface of one of the release green sheets 13 is being applied to the laminate, the pressure ranging between 2 and 20 kgf/cm$^2$. Thus, the multilayered ceramic substrate is co fired with the capacitor 19 and the resistor incorporated therein. The laminate can be fired in an oxidizing atmosphere (air) when any one of Ag, Ag/Pd, Au, and Ag/Pt has been used as each of the wiring and interlayer via conductor pastes 16 and 17, whereas the laminate needs to be fired in a reducing atmosphere for inhibition of oxidation when Cu has been used as each of the wiring and interlayer via conductor pastes 16 and 17. In this regard, since the release green sheets 13 (alumina green sheets) laminated to both side faces of the substrate are sintered at 1,550° to 1,600° C., the release green sheets 13 remain unsintered when the substrate laminate is fired at 800° to 1,000° C. The solvent and/or the binder in the release green sheets 13 are scattered in the firing process, remaining as an alumina powder.

10. Finishing:

The release green sheets 13 or alumina powder adherent to both side faces of the substrate is removed by means of polishing or the like after the firing. Subsequently, the surface layer conductor paste 20 is screen printed on the top and bottom of the substrate to be formed into wiring patterns and then, the substrate is fired at or below 1,000° C., whereby the fabrication of the multilayered ceramic substrate having incorporated capacitor 19 and resistor is completed.

Examples according to the above-described fabrication method and a compared case will now be described. The following TABLE 1 shows examples 1 to 4 according to the above-described method and the following TABLE 2 shows the compared case. Au or an Au alloy such as Au/Pd/Ag was used as an electrode conductor material for the capacitor 19.

TABLE 1

|  | Example 1 | Example 2 | Example 3 | Example 4 |
|---|---|---|---|---|
| Composition of insulator green sheet | Glass of CaO-Al$_2$O$_3$-SiO$_2$-B$_2$O$_3$ system + Al$_2$O$_3$ | Glass of MgO-Al$_2$O$_3$-SiO$_2$-B$_2$O$_3$ system + Al$_2$O$_3$ | Glass of CaO-Al$_2$O$_3$-SiO$_2$-B$_2$O$_3$ system + Al$_2$O$_3$ | Glass of CaO-Al$_2$O$_3$-SiO$_2$-B$_2$O$_3$ system + Al$_2$O$_3$ |
| Composition of dielectric of capacitor | Compound of Pb-perovskite | Compound of SrTiO$_3$ system | Compound of Pb-perovskite | Compound of Pb-perovskite |
| Electrodes of capacitor | Au | Au | Au/Pd/Ag | Au |
| Inside layer wiring conductor | Ag | Ag/Pd | Ag | Au |
| Inside layer resistor | Glass of RuO$_2$ system | None | Glass of Bi$_2$Ru$_2$O$_7$ system | None |
| Release green sheets | Al$_2$O$_3$ | Al$_2$O$_3$ | Al$_2$O$_3$ | Al$_2$O$_3$ |
| Surface layer conductor | Ag/Pd | Cu | Au | Ag/Pt |
| Firing temperature | 900° C. | 900° C. | 900° C. | 900° C. |
| Pressure applied during firing | 2 kgf/cm$^2$ | 10 kgf/cm$^2$ | 20 kgf/cm$^2$ | 8 kgf/cm$^2$ |
| Dielectric constant of capacitor | 2500 | 200 | 4000 | 3000 |

TABLE 1-continued

|  | Example 1 | Example 2 | Example 3 | Example 4 |
|---|---|---|---|---|
| dielectric Capacitor High-temp. load reliability test | OK | OK | OK | OK |
| Camber, crack, distortion | None | None | None | None |
| Dielectric constant of dielectric layer | 7.7 | 6.2 | 7.7 | 7.7 |

TABLE 2

|  | Compared case 1 |
|---|---|
| Composition of insulator green sheet | Glass of CaO-Al$_2$O$_3$-SiO$_2$-B$_2$O$_3$ system + Al$_2$O$_3$ |
| Composition of dielectric of capacitor | Compound of Pb-perovskite |
| Electrodes of capacitor | Au |
| Inside layer wiring conductor | Ag |
| Inside layer resistor | None |
| Release green sheets | None |
| Surface layer conductor | Ag/Pd |
| Firing temperature | 900° C. |
| Pressure applied during firing | Not applied |
| Dielectric constant of capacitor dielectric | 2,200 |
| High-temp. load reliability test for capacitor | OK |
| Camber, crack, distortion | Camber of 40 μm and the others unfound |
| Dielectric constant of dielectric layer | 7.7 |

Example 1

A mixture of 60% glass of CaO-Al$_2$O$_3$-SiO$_2$-B$_2$O$_3$ system by weight and 40% alumina powder by weight was used as a ceramic insulator material forming each insulator green sheet 11. A compound of Pb-perovskite (PbO-Fe$_2$O$_3$-Nb$_2$O$_5$-WO$_3$-ZnO) was used as a material for a dielectric for the capacitor 19. Au was used as a material for electrode conductors of the capacitor 19. Ag was used as a material for the inside layer wiring conductors. A glass of RuO$_2$ system was used as a material for the inside layer resistor. Ag/Pd was used as a material for the surface layer conductor. Each release green sheet 13 was an alumina green sheet. The substrate laminate composed as described above was fired at 900° C., being pressurized at 2 kgf/cm$^2$. No camber, crack, or distortion was produced in the substrate. Furthermore, a capacitor high temperature load reliability test was carried out. In this test, a load of 50 V direct current was continuously applied to the substrate at 150° C. for 1,000 hours. As a result of the test, no deterioration was found in the insulation resistance in the dielectric layer of the capacitor 19, and an insulation resistance of or above 10$^6$ Ω was secured. Furthermore, the dielectric constant of the dielectric layer was 2,500 and that of the insulator layer was 7.7.

Example 2

A mixture of 60% glass of MgO-Al$_2$O$_3$-SiO$_2$-B$_2$O$_3$ system by weight and 40% alumina powder by weight was used as a ceramic insulator material forming the insulator green sheet 11. A compound of $SrTiO_3$ system was used as a material for a dielectric for the capacitor 19. Au was used as a material for electrode conductors of the capacitor 19. Ag/Pd was used as a material for the inside layer wiring conductors. No inside layer resistor was provided. Cu was used as a material for the surface layer conductor. Each release green sheet 13 was an alumina green sheet. The substrate laminate composed as described above was fired at 900° C., being pressurized at 10 $kgf/cm^2$. No camber, crack, or distortion was produced in the substrate. Furthermore, as a result of the capacitor high temperature load reliability test, no deterioration was found in the insulation resistance in the dielectric layer of the capacitor 19, and an insulation resistance of or above $10^6$ Ω was secured. Furthermore, the dielectric constant of the dielectric layer was 200 and that of the insulator layer was 6.2.

Example 3

Differing from the substrate of EXAMPLE 1, the substrate of EXAMPLE 3 comprises the capacitor electrode conductors each formed from Au/Pd/Ag, the inside layer resistor formed from a glass of $Bi_2Ru_2O_7$. The other composition of the substrate of EXAMPLE 3 was the same as that of EXAMPLE 1. The substrate laminate composed as described above was fired at 900° C., being pressurized at 20 $kgf/cm^2$. No camber, crack, or distortion was produced in the substrate. Furthermore, as a result of the capacitor high temperature load reliability test, no deterioration was found in the insulation resistance in the dielectric layer of the capacitor 19, and an insulation resistance of or above $10^6$ Ω was secured. Furthermore, the dielectric constant of the dielectric layer was 4,000 and that of the insulator layer was 7.7.

Example 4

Differing from the substrate of EXAMPLE 1, the substrate of EXAMPLE 4 comprises the inside layer wiring conductor formed from Au and the surface layer conductor formed from Ag/Pt. The substrate of EXAMPLE 4 has no inside layer resistor. The other composition of the substrate of EXAMPLE 4 was the same as that of EXAMPLE 1. The substrate laminated composed as described above was fired at 900° C., being pressurized at 20 $kgf/cm^2$. No camber, crack, or distortion was produced in the substrate. Furthermore, as a result of the capacitor high temperature load reliability test, no deterioration was found in the insulation resistance in the dielectric layer of the capacitor 19, and an insulation resistance of or above $10^6$ Ω was ensured. Furthermore, the dielectric constant of the dielectric layer was 3,000 and that of the insulator layer was 7.7.

As obvious from EXAMPLES 1 to 4 described above, when the substrate laminate is fired while being pressurized at a pressure ranging between 2 to 20 $kgf/cm^2$, the camber, crack, or distortion can be prevented in the substrate, and the density of the substrate (the insulator layer and the dielectric layer) after the firing can be improved such that a better insulation performance of each of the insulator and dielectric layers can be maintained. The multilayered ceramic substrate is deformed when the pressure applied thereto during the firing exceeds 20 $kgf/cm^2$, whereas the applied pressure is so small that the density of the substrate cannot be improved when the applied pressure is below 2 $kgf/cm^2$. Consequently, a proper range of applied pressure is between 2 and 20 $kgf/cm^2$.

Compared Case 1

Differing from EXAMPLE 1, COMPARED CASE 1 used a substrate laminate having no inside layer resistor and no release green sheets 13. The substrate laminate was fired at 900° C. without pressurization. In this firing method, a camber of 40 $\mu m$ was produced in the substrate. This shows that the pressurized firing is effective for prevention of camber in the substrate.

Since Au or the Au alloy was used as the electrode conductors in each of EXAMPLES 1–4 and COMPARED CASE 1, no deterioration was found in the insulation resistance in the dielectric layer of the capacitor 19. Consequently, the insulation reliability was improved in the dielectric layer.

The following TABLE 3 shows EXAMPLES 5 to 8 and the following TABLE 4 shows COMPARED CASES 2 and 3. Ag/Pd was used as a material for the electrode conductors of the capacitor 19 in each example and case.

TABLE 3

| | Example 5 | Example 6 | Example 7 | Example 8 |
|---|---|---|---|---|
| Composition of insulator green sheet | Glass of $CaO-Al_2O_3$-$SiO_2$-$B_2O_3$ system + $Al_2O_3$ | Glass of $MgO-Al_2O_3$-$SiO_2$-$B_2O_3$ system + $Al_2O_3$ | Glass of $CaO-Al_2O_3$-$SiO_2$-$B_2O_3$ system + $Al_2O_3$ | Glass of $CaO-Al_2O_3$-$SiO_2$-$B_2O_3$ system + $Al_2O_3$ |
| Composition of dielectric of capacitor | Compound of Pb-perovskite | Compound of $SrTiO_3$ system | Compound of Pb-perovskite | Compound of Pb-perovskite |
| Electrodes of capacitor | Ag/Pd in weight ratio of 70/30 | Ag/Pd in weight ratio of 90/10 | Ag/Pd in weight ratio of 80/20 | Ag/Pd in weight ratio of 70/30 |
| Inside layer wiring conductor | Ag | Ag/Pd | Ag | Au |
| Inside layer resistor | Glass of $RuO_2$ system | None | Glass of $Bi_2Ru_2O_7$ system | None |
| Release green sheets | $Al_2O_3$ | $Al_2O_3$ | $Al_2O_3$ | $Al_2O_3$ |
| Surface layer conductor | Ag/Pd | Cu | Au | Ag/Pt |
| Firing temperature | 900° C. | 900° C. | 900° C. | 900° C. |
| Pressure applied during firing | 2 $kgf/cm^2$ | 10 $kgf/cm^2$ | 20 $kgf/cm^2$ | 8 $kgf/cm^2$ |
| Dielectric constant of capacitor dielectric | 2000 | 150 | 3500 | 2700 |
| Capacitor High-temp. load reliability test | OK | OK | OK | OK |
| Camber, crack, distortion | None | None | None | None |
| Dielectric constant of dielectric layer | 7.7 | 6.2 | 7.7 | 7.7 |

TABLE 4

| | Compared case 2 | Compared case 3 |
|---|---|---|
| Composition of insulator green sheet | Glass of $CaO-Al_2O_3$-$SiO_2$-$B_2O_3$ system + $Al_2O_3$ | Class of $CaO-Al_2O_3$-$SiO_2$-$B_2O_3$ system + $Al_2O_3$ |
| Composition of dielectric of capacitor | Compound of Pb-perovskite | Compound of Pb-perovskite |
| Electrodes of capacitor | Ag/Pd in weight | Ag/Pd in weight |

TABLE 4-continued

|  | Compared case 2 | Compared case 3 |
|---|---|---|
|  | ratio of 70/30 | ratio of 95/5 |
| Inside layer wiring conductor | Ag | Ag |
| Inside layer resistor | None | None |
| Release green sheets | None | $Al_2O_3$ |
| Surface layer conductor | Ag/Pd | Ag/Pt |
| Firing temperature | 900° C. | 900° C. |
| Pressure applied during firing | Not applied | 10 kgf/cm$^2$ |
| Dielectric constant of capacitor dielectric | 1,500 | 4,000 |
| High-temp. load reliability test for capacitor | OK | Short-circuited in 20 hours |
| Camber, crack, distortion | Camber of 60 μm and the others unfound | Unfound |
| Dielectric constant of dielectric layer | 7.7 | 7.7 |

Ag/Pd having an Ag/Pd weight ratio of 70/30 was used as a material for the electrode conductors in EXAMPLE 5. The other composition of the substrate and firing conditions in EXAMPLE 5 were the same as those in EXAMPLE 1.

Ag/Pd having an Ag/Pd weight ratio of 90/10 was used as a material for the electrode conductors in EXAMPLE 6. The other composition of the substrate and firing conditions in EXAMPLE 6 were the same as those in EXAMPLE 2.

Ag/Pd having an Ag/Pd weight ratio of 80/20 was used as a material for the electrode conductors in EXAMPLE 7. The other composition of the substrate and firing conditions in EXAMPLE 7 were the same as those in EXAMPLE 3.

Ag/Pd having an Ag/Pd weight ratio of 70/30 was used as a material for the electrode conductors in EXAMPLE 8. The other composition of the substrate and firing conditions in EXAMPLE 8 were the same as those in EXAMPLE 4.

No camber, crack, or distortion was produced in the substrates after the firing in EXAMPLES 5 to 8 as in the foregoing EXAMPLES 1 to 4. Furthermore, as a result of the capacitor high temperature load reliability test, no deterioration was found in the insulation resistance in the dielectric layer of the capacitor 19 and an insulation resistance of or above $10^7$ Ω was ensured in each of EXAMPLES 5 to 8, which value was larger by one place than that in each of EXAMPLES 1 to 4. The dielectric constants in EXAMPLES 5 to 8 were smaller by 10 to 25% than those in EXAMPLES 1 to 4.

COMPARED CASE 2 as shown in TABLE 4 differed from EXAMPLE 5 in that no inside layer resistor was provided, that no release green sheet was used, and that the substrate laminate was not pressurized during the firing. A camber of 60 μm was produced in the fired substrate in COMPARED CASE 2. This shows that the pressurized firing is effective in the prevention of camber in the substrate.

Furthermore, COMPARED CASE 3 differed from EXAMPLE 5 in that Ag/Pd having an Ag/Pd weight ratio of 95/5 was used as a material for the electrode conductors, that no inside layer resistor was provided, and that Ag/Pt was used as a material for the surface layer conductor. No camber, crack, or distortion was produced in the substrate of COMPARED CASE 3 when the same was fired at 900° C., being pressurized at 10 kgf/cm$^2$. In the capacitor high temperature load reliability test, however, a deterioration was found in the insulation resistance in the dielectric layer of the capacitor 19 and a short-circuit took place after the lapse of 20 hours. This is considered to be due to a too small proportion of Pd in the weight ratio of Ag/Pd used as the material for the electrode conductors.

On the other hand, the Ag/Pd weight ratio of Ag/Pd used as the material for the electrode conductors was ranged between 90/10 and 60/40 in EXAMPLES 5 to 8. No deterioration was found in the insulation resistance in the dielectric layer of the capacitor 19 in each of EXAMPLES 5 to 8 such that the insulation reliability of the dielectric layer was improved. The inventors experimentally confirmed that a proper range of the weight ratio of Ag/Pd used as the material for the electrode conductors was between 90/10 and 60/40 and that the insulation reliability of the dielectric layer was lowered when the weight ratio of Ag/Pd was out of the above-mentioned range.

Second embodiment:

It is generally preferred that a dielectric layer have a thickness of or above 30 μm after the sintering for the ensuring of a sufficient insulation performance between the electrode conductors or that it have a thickness of or above 60 μm while being dried in its paste phase before the sintering. When upper and lower electrode conductors are added to the dielectric layer, the whole capacitor should have a thickness of or above 80 μm before the sintering. In the laminate structure as shown in FIGS. 1A and 1B, accordingly, the layer on which the capacitor 19 is to be formed has a stepped portion of or above 80 μm in thickness on it portion of the capacitor 19. Since the applied pressure is concentrated on the capacitor 19, there is a possibility that an outer peripheral end of the capacitor 19 may be squeezed by the applied pressure to be deformed. This may reduce the insulation performance.

In view of the above-described problem, in a second embodiment of the present invention as shown in FIGS. 2A to 3B, a spacer insulator green sheet 22 is laminated to a layer in which the capacitor 19 is to be formed, for the purpose of preventing the outer peripheral end of the capacitor 19 from being deformed by the applied pressure. The spacer insulator green sheet 22 has an opening 21 defining a formation area for the dielectric layer 12. The spacer insulator green sheet 22 is formed from the same low temperature sinterable insulator ceramic material as for those of the other layers (insulator layers) in the same process as described in the first embodiment. However, the spacer insulator green sheet 22 has a thickness approximately the same as the dielectric layer 12 of the capacitor 19 and smaller than the insulator green sheets 11 of the other layers.

The fabrication method of the second embodiment will be described with reference to FIGS. 2A to 3B. The differences between the first and second embodiments will be described. The identical or similar parts in the second embodiment are labeled by the same reference symbols as in the first embodiment and detailed description of these parts will be eliminated.

Figure 2A:
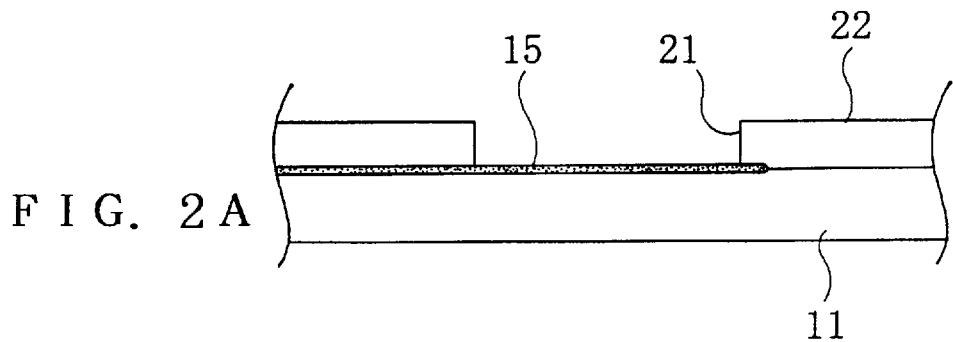
FIGS. 2A to 2D are views showing fabrication steps in a second embodiment in accordance with the present invention.
Figure 2B:
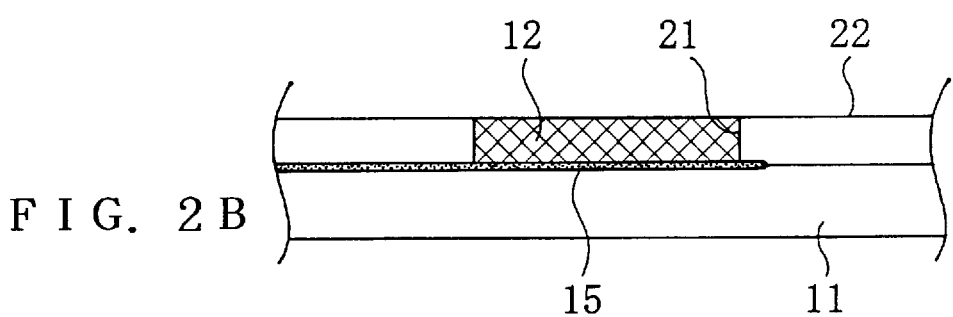

First, the electrode conductor paste 15 is screen printed on the insulator green sheet 11 of the lower layer on which the capacitor 19 is to be formed, so that a lower electrode of the capacitor 19 is formed. Subsequently, the spacer insulator green sheet 22 having the opening 21 in the formation area of the dielectric layer 12 of the capacitor 19 is laminated to the insulated green sheet 11 of the lower layer, as is shown in FIG. 2A. The opening 21 of the spacer insulator green sheet 22 is then filled with the low temperature co-firable ceramic dielectric material 12 so that a dielectric layer is formed, as is shown in FIG. 2B. The low temperature co-firable ceramic dielectric material 12 used here may be a compound of Pb-perovskite or a compound of $SrTiO_3$ system as used in the first embodiment. In the filling of the opening 21 with the low temperature co-firable ceramic dielectric material 12, a dielectric paste may be printed on the portion of the electrode conductor paste 15 defined by the opening 21, or a dielectric green sheet may be cut so as to have the same size as the opening 21 to be fitted into the latter.

Figure 2C:
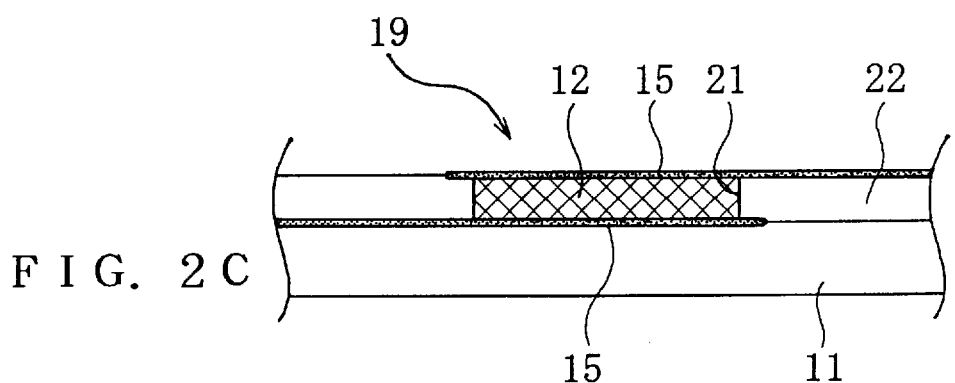
Figure 2D:
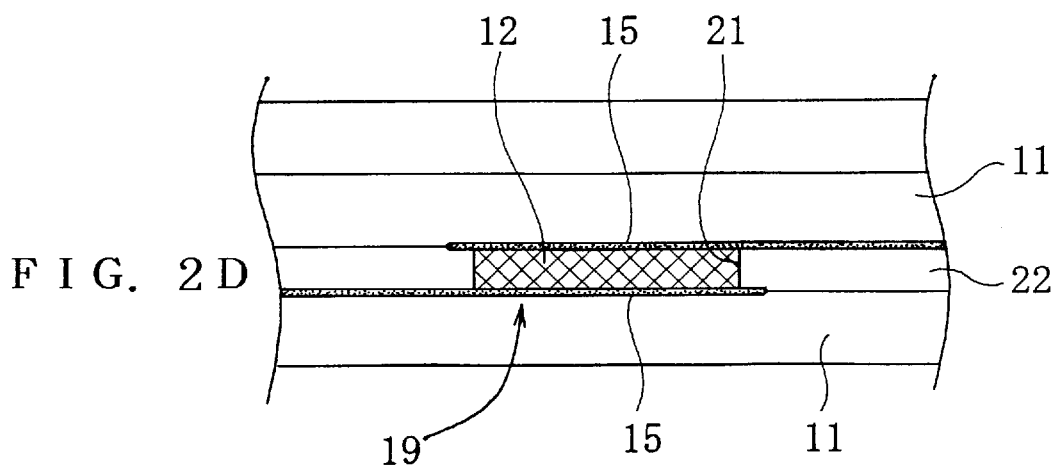

Subsequently, the electrode conductor paste 15 is screen printed on the top face of the dielectric layer 12 and its peripheral portion so that an upper electrode of the capacitor 19 is formed, as is shown in FIG. 2C. The insulator green sheets 11 are laminated to the spacer insulator green sheet 22 with the capacitor 19 in turn, whereby the substrate laminate is fabricated. The substrate laminate is crimped at 50 to 250 kgf/cm$^2$, being heated at 80° to 150° C., for example, so that the laminate is integrated, as is shown in FIG. 2D.

Subsequently, unfired release green sheets 13 (alumina green sheets) are laminated to both sides of the substrate laminate respectively. The substrate laminate with the release green sheets 13 is then heated and crimped in the same manner as described above. The substrate laminate with the green sheets 13 is then fired at a substrate firing temperature ranging between 800 and 1,000 C., being pressurized at a pressure ranging between 2 and 20 kgf/cm$^2$, whereby a multilayered ceramic substrate is co-fired with the capacitor 19 incorporated therein.

The release green sheets 13 (an alumina powder) adherent to the respective sides of the substrate are removed by means of polishing or the like after the firing. Thereafter, the surface layer conductor paste 20 is screen printed on the surface of the substrate to be formed into a wiring pattern. The substrate is then fired at or below 1,000° C., whereby the fabrication of the multilayered ceramic substrate having the incorporated capacitor 19 is completed.

The inventors fabricated multilayered ceramic substrates of EXAMPLES 1 to 4 as shown in TABLE 5 in accordance with the above-described method of the second embodiment to evaluate a rate of occurrence of short circuit in each EXAMPLE.

TABLE 5

|  | Example 1 | Example 2 | Example 3 | Example 4 |
|---|---|---|---|---|
| Composition of insulator green sheet | Glass of CaO-Al$_2$O$_3$-SiO$_2$-B$_2$O$_3$ system + Al$_2$O$_3$ | Glass of CaO-Al$_2$O$_3$-SiO$_2$-B$_2$O$_3$ system + Al$_2$O$_3$ | Glass of CaO-Al$_2$O$_3$-SiO$_2$-B$_2$O$_3$ system + Al$_2$O$_3$ | Glass of CaO-Al$_2$O$_3$-SiO$_2$-B$_2$O$_3$ system + Al$_2$O$_3$ |
| Capacitor Spacer | Insulator green sheet | Insulator green sheet | Insulator green sheet | Insulator green sheet |
| Material for dielectric of capacitor | Compound of Pb-perovskite | Compound of Pb-perovskite | Compound of Pb-perovskite | Compound of SrTiO$_3$ system |
| Electrodes of capacitor | Au | Ag/Pd in weight ratio of 70/30 | Ag/Pd in weight ratio of 80/20 | Ag |
| Inside layer wiring conductor | Ag | Ag | Ag/Pd | Ag |
| Release green sheets | Al$_2$O$_3$ | Al$_2$O$_3$ | Al$_2$O$_3$ | Al$_2$O$_3$ |
| Surface layer conductor | Ag/Pd | Ag/Pt | Au | Cu |
| Firing temperature | 900° C. | 900° C. | 900° C. | 900° C. |
| Pressure applied during firing | 5 kgf/cm$^2$ | 5 kgf/cm$^2$ | 5 kgf/cm$^2$ | 5 kgf/cm$^2$ |
| Rate of occurrence of short-circuit | 0% | 0% | 0% | 0% |

The spacer insulator green sheet 22 was laminated around the dielectric layer in each of EXAMPLES 1 to 4 in TABLE 5. No stepped portion was formed by the dielectric layer on the layer on which the capacitor was formed. Deformation of the outer peripheral end of the capacitor was prevented by the spacer insulator green sheet 22 when the substrate laminate was fired under pressure. Consequently, the thickness of the dielectric layer 12 remained the same at the outer peripheral end of the capacitor 19 as in the central portion thereof and accordingly, the reduction in the insulation performance at the outer peripheral end of the capacitor 19 was prevented. Thus, the rate of occurrence of short-circuit was 0% in each of EXAMPLES 1 to 4 shown in TABLE 5, whereby a high insulation reliability was ensured. Furthermore, the characteristics of the capacitor 19 were stabilized since the variations in a capacity and an insulation resistance thereof due to the deformation of the outer peripheral end of the capacitor 19 were also prevented. Consequently, the method of the second embodiment provided a high quality of multilayered ceramic substrate having an incorporated capacitor.

TABLE 6 shows other COMPARED CASES 1 to 4 in each of which the substrate laminate was fired under pressure without the spacer insulator green sheet 22 being laminated around the dielectric layer. The other conditions were the same as those in EXAMPLES 1 to 4 in TABLE 5.

TABLE 6

|  | Compared cases | | | |
|---|---|---|---|---|
|  | 1 | 2 | 3 | 4 |
| Composition of insulator green sheet | Glass of CaO-Al$_2$O$_3$-SiO$_2$B$_2$O$_3$ system + Al$_2$O$_3$ | Glass of CaO-Al$_2$O$_3$-SiO$_2$B$_2$O$_3$ system + Al$_2$O$_3$ | Glass of CaO-Al$_2$O$_3$-SiO$_2$B$_2$O$_3$ system + Al$_2$O$_3$ | Glass of CaO-Al$_2$O$_3$-SiO$_2$B$_2$O$_3$ system + Al$_2$O$_3$ |
| Capacitor Spacer | None | None | None | None |
| Material for dielectric of capacitor | Compound of Pb-perovskite | Compound of Pb-perovskite | Compound of Pb-perovskite | Compound of SrTiO$_3$ system |
| Electrodes of capacitor | Au | Ag/Pd in weight ratio of 70/30 | Ag/Pd in weight ratio of 80/20 | Ag |
| Inside layer wiring conductor | Ag | Ag | Ag/Pd | Ag |
| Release green sheets | Al$_2$O$_3$ | Al$_2$O$_3$ | Al$_2$O$_3$ | Al$_2$O$_3$ |
| Surface layer conductor | Ag/Pd | Ag/Pt | Au | Cu |
| Firing temperature | 900° C. | 900° C. | 900° C. | 900° C. |
| Pressure applied during firing | 5 kgf/cm$^2$ | 5 kgf/cm$^2$ | 5 kgf/cm$^2$ | 5 kgf/cm$^2$ |
| Rate of occurrence of short-circuit | 33% | 29% | 26% | 11% |

In each of these compared cases, the provision of a capacitor resulted in a stepped portion of or above 80 μm on a layer in which the capacitor was formed since a spacer insulator green sheet 22 was not laminated around the dielectric layer. Accordingly, the outer peripheral end of the capacitor was squeezed by the applied pressure to be deformed such that the insulation performance at the outer peripheral end of the capacitor tended to be reduced. Consequently, since the rate of occurrence of short-circuit was a maximum of 33% and a minimum of 11%, the yield of products was reduced.

Modified forms:

Other usable low temperature co-firable ceramic insulator materials include ceramic materials which can be fired at or below 1,000° C., such as a glass of SiO$_2$-B$_2$O$_3$ system and Al$_2$O$_3$ system, a glass of PbO-SiO$_2$-B$_2$O$_3$ system and Al$_2$O$_3$ system, and crystallized glass of cordierite system.

The compound of Pb-perovskite or the compound of SrTiO$_3$ system was used as the material for the dielectric of the capacitor 19 in the foregoing embodiments. A compound of BaTiO$_3$ system or a compound of CaTiO$_3$ system may be used as the material for the dielectric, instead. These compounds are suitable for the fabrication of a capacitor since they are co-firable with the low temperature co-firable ceramic insulator material at or below 1,000° C. and have respective high dielectric constants.

An Ru pyrochlore may be used as the material for the resistor, instead of RuO$_2$. The Ru pyrochlore is co-firable with the low temperature co-firable ceramic as well as RuO$_2$.

Although the alumina green sheet is used as the release green sheet in the foregoing embodiments, the release green sheet may be a green sheet made of a ceramic material having a high firing temperature, such as SiC or AlN, instead.

Although a single capacitor is provided in the multilayered ceramic substrate in the foregoing embodiments, a plurality of such capacitors may be provided in the same manner as described above.

The foregoing description and drawings are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:

1. A method of manufacturing a multilayered ceramic substrate with an integrally incorporated capacitor by co-firing the substrate and the capacitor at a substrate firing temperature ranging between 800° to 1,000° C., the method comprising the sequential steps of:

forming a substrate laminate having a capacitor interposed between green insulator layers each comprised of a ceramic insulator material, the capacitor comprising a green dielectric layer comprised of a ceramic dielectric material and electrode conductors sandwiching the dielectric layer;

laminating release green sheets unsintered at the substrate firing temperature ranging between 800° to 1,000° C. to both sides of the substrate laminate respectively;

firing the substrate laminate with the release green sheets at the substrate firing temperature ranging between 800° to 1,000° C. while applying thereto a pressure normal to an exposed surface of one of the release green sheets, the pressure ranging between 2 and 20 kgf/cm$^2$; and removing the release green sheets from both sides of the fired assemblage, thereby fabricating the multilayered ceramic substrate with the integrally incorporated capacitor.

2. The method of claim 1 wherein each green insulator layer comprises an insulator green sheet formed from a ceramic insulator material, and the green dielectric layer is formed by printing a low temperature co-firable ceramic dielectric material.

3. The method of claim 2 wherein the green dielectric layer is formed by laminating a spacer insulator green sheet having an opening defining a formation area of the dielectric layer to an inside insulator green sheet and filling the opening with the ceramic dielectric material in a process of laminating the insulator green sheets.

4. The method of claim 1 wherein each electrode conductor comprises Au or an Au alloy.

5. The method of claim 1 wherein each electrode conductor comprises Ag/Pd having an Ag/Pd weight ratio ranging between 90/10 to 60/40.

6. The method of claim 1 wherein the dielectric layer comprises a compound of Pb-perovskite.

7. The method of claim 1 wherein the ceramic insulator material comprises a mixture of a glass powder of a system of CaO-Al$_2$O$_3$-SiO$_2$-B$_2$O$_3$ or a system of MgO-Al$_2$O$_3$-SiO$_2$-B$_2$O$_3$ and an Al$_2$O$_3$ powder.

8. The method of claim 1 wherein the substrate laminate has inside or surface layers formed with wiring and interlayer via conductors each comprising Au, Ag, Ag/Pd, Ag/Pt, or Cu.

9. The method of claim 1 wherein the substrate laminate has an inside or surface layer formed with a resistor comprising RuO$_2$ or an Ru pyrochlore.

10. The method of claim 1 wherein each release green sheet comprises an alumina green sheet.

11. A multilayered ceramic substrate with an integrally incorporated capacitor formed by a method comprising the steps of:

forming a substrate laminate having a capacitor interposed between green insulator layers each comprised of a ceramic insulator material, the capacitor comprising a green dielectric layer comprised of a ceramic dielectric material and electrode conductors sandwiching the dielectric layer;

laminating release green sheets unsintered at a substrate firing temperature ranging between 800° to 1,000° C. to both sides of the substrate laminate respectively;

firing the substrate laminate with the release green sheets at the substrate firing temperature ranging between 800° to 1,000° C. while applying thereto a pressure normal to an exposed surface of one of the release green sheets, the pressure ranging between 2 and 20 kgf/cm$^2$; and removing the release green sheets from both sides of the fired assemblage.

* * * * *